(12) United States Patent
Kumagawa et al.

(10) Patent No.: US 9,331,635 B2
(45) Date of Patent: May 3, 2016

(54) QUADRATURE MODULATOR

(71) Applicant: Panasonic Corporation, Osaka (JP)

(72) Inventors: Masahiro Kumagawa, Hyogo (JP);
Yoshito Hirai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/661,762

(22) Filed: Mar. 18, 2015

(65) Prior Publication Data

US 2015/0194934 A1 Jul. 9, 2015

Related U.S. Application Data

(63) Continuation of application No. PCT/JP2014/003564, filed on Jul. 4, 2014.

(30) Foreign Application Priority Data

Jul. 18, 2013 (JP) .................................. 2013-149580

(51) Int. Cl.
*H03C 3/40* (2006.01)
*H03C 1/36* (2006.01)
(Continued)

(52) U.S. Cl.
CPC ................ *H03F 1/0205* (2013.01); *H03C 1/36* (2013.01); *H03C 3/40* (2013.01); *H03F 1/56* (2013.01);
(Continued)

(58) Field of Classification Search
CPC .............. H03C 1/12; H03C 3/40; H03C 1/36; H03C 2200/0058; H04L 27/2614; H04L 27/36; H03F 3/005; H03F 3/2178; H03F 3/19; H03F 3/245; H03F 1/56; H03F 3/2171; H03F 3/195; H03F 2200/336; H03F 2203/21142; H03F 2200/537; H03F 2200/09; H03F 2200/387; H03F 2200/541
USPC .............................. 332/103; 330/10; 375/298
See application file for complete search history.

(56) References Cited

U.S. PATENT DOCUMENTS 6,181,199 B1 1/2001 Camp, Jr. et al.
7,872,543 B2 1/2011 Ballantyne et al.
(Continued)

FOREIGN PATENT DOCUMENTS

JP   08-274544 A   10/1996
JP   2002-534908  10/2002
(Continued)

OTHER PUBLICATIONS

International Search Report of PCT application No. PCT/JP2014/003564 dated Sep. 22, 2014.
(Continued)

*Primary Examiner* — Ryan Johnson
(74) *Attorney, Agent, or Firm* — Seed IP Law Group PLLC

(57) ABSTRACT

A quadrature modulator includes a first switched capacitor power amplifier that amplifies a first high-frequency signal, a second switched capacitor power amplifier that amplifies a second high-frequency signal, a first combiner which includes at least one pair of winding wires, one winding wire in one pair being disposed on a primary side to which the amplified first high-frequency signal and the amplified second high-frequency signal are separately input and the other winding wire in the one pair being disposed on a secondary side, the first combiner combining the input amplified first high-frequency signal and the input amplified second high-frequency signal to generate a quadrature modulation signal from the secondary side, a first inductor disposed between the first switched capacitor power amplifier and the primary side of the first combiner, and a second inductor disposed between the second switched capacitor power amplifier and the primary side of the first combiner.

10 Claims, 8 Drawing Sheets

(51) Int. Cl.
*H04L 27/36* (2006.01)
*H03F 1/02* (2006.01)
*H03F 1/56* (2006.01)
*H03F 3/195* (2006.01)
*H03F 3/217* (2006.01)
*H03F 3/24* (2006.01)
*H03F 3/00* (2006.01)
*H03F 3/19* (2006.01)
*H04L 25/03* (2006.01)
*H04L 27/26* (2006.01)
*H03C 1/12* (2006.01)

(52) U.S. Cl.
CPC ............. *H03F 3/005* (2013.01); *H03F 3/19* (2013.01); *H03F 3/195* (2013.01); *H03F 3/2171* (2013.01); *H03F 3/2178* (2013.01); *H03F 3/245* (2013.01); *H04L 25/03343* (2013.01); *H04L 27/2614* (2013.01); *H04L 27/36* (2013.01); *H03C 1/12* (2013.01); *H03C 2200/0058* (2013.01); *H03F 2200/09* (2013.01); *H03F 2200/336* (2013.01); *H03F 2200/387* (2013.01); *H03F 2200/537* (2013.01); *H03F 2200/541* (2013.01); *H03F 2203/21142* (2013.01); *H04L 2025/03414* (2013.01)

(56) References Cited

U.S. PATENT DOCUMENTS

| | | | |
|---|---|---|---|
| 8,451,157 B2* | 5/2013 | Vilhonen | H03M 1/802 341/144 |
| 8,542,769 B2* | 9/2013 | Vilhonen | H03F 3/2175 341/144 |
| 8,547,177 B1* | 10/2013 | Yoo | H03F 1/565 330/295 |
| 8,693,578 B2 | 4/2014 | Kunihiro et al. | |
| 2009/0302963 A1 | 12/2009 | Ballantyne et al. | |
| 2011/0241781 A1 | 10/2011 | Owen et al. | |
| 2012/0287985 A1 | 11/2012 | Okamura et al. | |
| 2013/0016795 A1 | 1/2013 | Kunihiro et al. | |

FOREIGN PATENT DOCUMENTS

| | | |
|---|---|---|
| JP | 2011-525318 A | 9/2011 |
| JP | 2011-254245 | 12/2011 |
| JP | 2012-254003 | 12/2012 |
| JP | 2013-110619 A | 6/2013 |
| JP | 2013-524626 | 6/2013 |
| WO | 2011/070952 A1 | 6/2011 |
| WO | 2014/042270 A1 | 3/2014 |

OTHER PUBLICATIONS

Chao Lu, et al. "A 24.7dBm All-Digital RF Transmitter for Multimode Broadband Applications in 40nm CMOS" ISSCC2013 Session 19/Wireless Transceivaers for Smart Devices/19.3, Feb. 2013.

Sang-Min Yoo, et al. "A Switched-Capacitor RF Power Amplifier" IEEE J. Solid-state Circuits, vol. 46, No. 12, pp. 2977-2987, Dec. 2011.

* cited by examiner

QUADRATURE MODULATOR

BACKGROUND

1. Technical Field

The present disclosure relates to a power amplifier, and more particularly, to a quadrature modulator that performs quadrature modulation using a switched capacitor power amplifier.

2. Description of the Related Art

A power amplifier amplifies a weak input signal and outputs a resultant amplified signal to provide a signal with a high strength necessary in wireless communication. This amplification operation generally consumes large electric power. In particular, in a wireless communication apparatus (for example, a portable telephone or the like) driven by a battery, the power consumption has a significant influence on a maximum run time, and thus it is necessary to increase a power efficiency to reduce the power consumption.

One known method of increasing the power efficiency is to use a Class-D power amplifier. The Class-D power amplifier is an amplifier that operates using saturation of a transistor such that a current is passed through the transistor only during a switching period, which makes it possible to achieve low power consumption and high power efficiency. This type of amplifier is advantageous for use in modulation method in which a large change in amplitude does not occur.

However, in recent years, to achieve a better spectrum efficiency, orthogonal frequency-division multiplexing (hereinafter referred to as OFDM) has been widely used as a modulation method. For example, the OFDM is used in a wireless local area network (WLAN). In the OFDM, a plurality of carriers with different frequencies are modulated, and the modulated carriers are multiplexed such that the carriers are orthogonal to each other.

In the OFDM, at timings when phases of carriers overlap, a high power peak relative to average power occurs. The ratio of the peak power to the average power is referred to as a peak average power ratio (PAPR), which may be as large as 10 dB depending on a situation. In the OFDM, by nature of the principle of its operation, the PAPR is large. Therefore, to suppress an influence of intersymbol interference caused by distortion, a linear amplifier is used. In this case, if parameters are set such that the peak power is equal to the saturation power of the power amplifier, when the power amplifier operates with the average power that is smaller than the saturation power, the power amplifier operates at an operating point shifted from an operating point that provides a high efficiency, and thus a reduction in power efficiency occurs. In a case where there is a large difference between the average power and the saturation power, to ease the reduction in the power efficiency, it is common to cut peak power within a range in which resultant distortion is lower than an allowable level thereby reducing the PAPR. The difference between the maximum power and the average power in the state in which the peak power is cut is referred to as a backoff. With increasing backoff, the efficiency of the power amplifier decreases.

To handle the above-described situation, it is known to use a digital power amplifier such as that disclosed, for example, in Chao Lu, Hua Wang, C H Peng, Ankush Goel, SangWon Son, Paul Liang, Ali Hwang, and George Chein "A 24.7 dBm All-Digital RF Transmitter for Multimode Broadband Applications in 40 nm CMOS" ISSCC2013 SESSION 19/WIRELESS TRANSCEIVERS FOR SMART DEVICES/19.3. In the digital power amplifier, quadrature modulation is employed instead of polar modulation that is difficult to achieve for a signal with a large signal bandwidth, and a balun is used to combine currents.

In the digital power amplifier disclosed in Chao Lu, Hua Wang, C H Peng, Ankush Goel, SangWon Son, Paul Liang, Ali Hwang, and George Chein "A 24.7 dBm All-Digital RF Transmitter for Multimode Broadband Applications in 40 nm CMOS" ISSCC2013 SESSION 19/WIRELESS TRANSCEIVERS FOR SMART DEVICES/19.3, power amplifiers, each of which allows a fixed current to flow when operated, are cascode-connected, and the number of power amplifiers in operation is controlled so as to be proportional to a digital code thereby controlling the total current. The currents are combined using a balun and a resultant combined current is output to a load thereby providing output power. The digital code is a baseband signal up-sampled by an up-sampling digital front end. Thus, in the digital power amplifier disclosed in Chao Lu, Hua Wang, C H Peng, Ankush Goel, SangWon Son, Paul Liang, Ali Hwang, and George Chein "A 24.7 dBm All-Digital RF Transmitter for Multimode Broadband Applications in 40 nm CMOS" ISSCC2013 SESSION 19/WIRELESS TRANSCEIVERS FOR SMART DEVICES/19.3, currents always flow, which results in an increase in consumption current and thus a reduction in a power efficiency.

To ease the problem described above, it is known to use a switched capacitor power amplifier, as disclosed, for example, in Sang-Min Yoo, Jeffrey, S. Walling, Eum Chan Woo, Benjamin Jann and David J. Allstat, "A Switched-Capacitor RF Power Amplifier" IEEE J. Solid-state Circuits, vol. 46, no. 12, pp. 2977-2987, December 2011. In this switched capacitor power amplifier, the amplitude of the output voltage of an amplifier is controlled by controlling the number of Class-D power amplifiers being in operation according to a digital code. The Class-D power amplifier is an amplifier that allows a current to flow only during a switching period, which results in an increase in power efficiency. The switched capacitor power amplifier disclosed in Sang-Min Yoo, Jeffrey, S. Walling, Eum Chan Woo, Benjamin Jann and David J. Allstat, "A Switched-Capacitor RF Power Amplifier" IEEE J. Solid-state Circuits, vol. 46, no. 12, pp. 2977-2987, December 2011 is used to control the amplitude in the polar modulation.

SUMMARY

When switched capacitor power amplifiers of the type described above are used as an I-side power amplifier and a Q-side power amplifier in a quadrature modulator, and outputs from the respective power amplifiers are combined using a balun, a combination loss occurs, which results in a reduction in output power and power efficiency.

One non-limiting and exemplary embodiment provides, in view of the above, a quadrature modulator capable of combining outputs from a plurality of switched capacitor power amplifiers without generating a combination loss, thereby achieving a high-efficiency operation and high output power.

In one general aspect, the techniques disclosed here feature that a quadrature modulator includes a first switched capacitor power amplifier that amplifies a first high-frequency signal having a first phase, a second switched capacitor power amplifier that amplifies a second high-frequency signal having a second phase different from the first phase, a first combiner which comprises at least one pair of winding wires that are magnetically coupled to each other, one winding wire in one pair being disposed on a primary side to which the amplified first high-frequency signal and the amplified second high-frequency signal are separately input and the other winding wire in the one pair being disposed on a secondary side, the first combiner combining the input amplified first high-frequency signal and the input amplified second high-frequency signal to generate a quadrature modulation signal from the secondary side, a first inductor disposed between the first switched capacitor power amplifier and the primary side of the first combiner, and a second inductor disposed between the second switched capacitor power amplifier and the primary side of the first combiner.

Thus, the quadrature modulator according to one general aspect of the present disclosure is capable of combining outputs from a plurality of switched capacitor power amplifiers without generating a combination loss, thereby achieving a high-efficiency operation and high output power.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Embodiments of the present disclosure are described below with reference to drawings.

First Embodiment

A quadrature modulator 100 according to a first embodiment of the present disclosure is described below.

Figure 1:
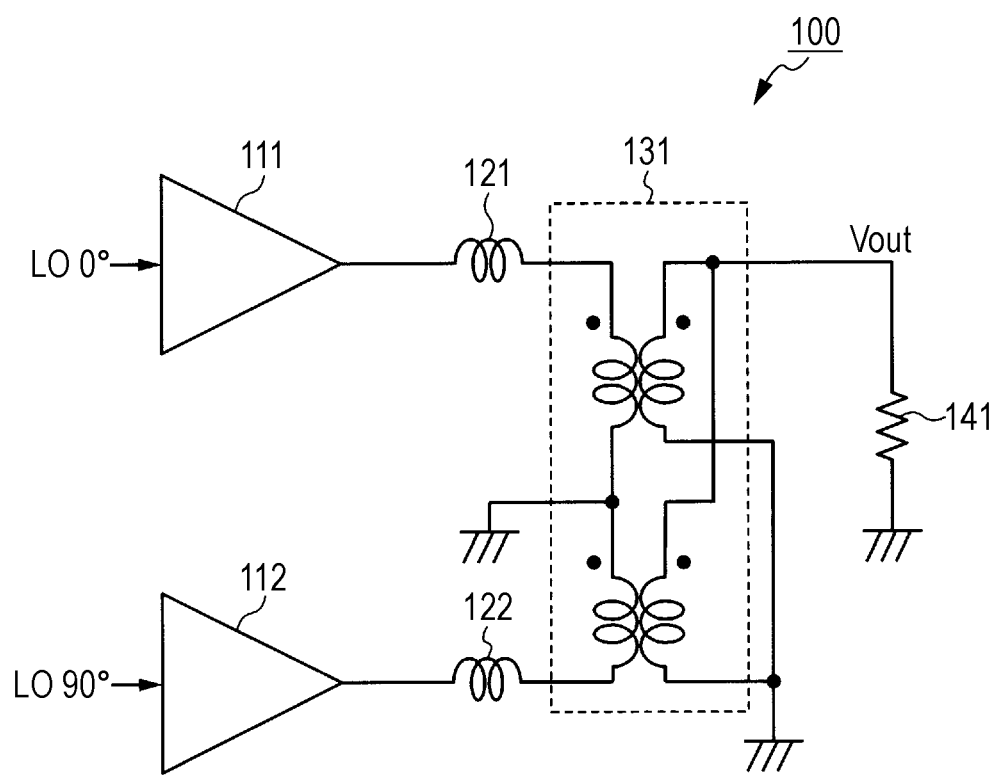
FIG. 1 is a diagram illustrating an example of a circuit configuration of a quadrature modulator according to a first embodiment of the present disclosure.

FIG. 1 is a diagram illustrating an example of a circuit configuration of the quadrature modulator 100 according to the first embodiment. As illustrated in FIG. 1, the quadrature modulator 100 includes amplifiers 111 and 112, inductors 121 and 122, and a balun 131.

The amplifier 111 and the amplifier 112 each are a switched capacitor power amplifier (SCPA). In the quadrature modulator 100, a part including the amplifier 111 will be referred to as an I side, and a part including the amplifier 112 will be referred to as a Q side.

There is a relative phase difference of 90° between a high-frequency signal input to the amplifier 111 and a high-frequency signal input to the amplifier 112. That is, the phases of the two high-frequency signals are different by 90° such that the two high-frequency signals are orthogonal to each other. In FIG. 1, by way of example, a high-frequency signal with a phase of 0° is input to the amplifier 111, and a high-frequency signal with a phase of 90° is input to the amplifier 112.

An output terminal of the amplifier 111 is connected to an input terminal of the inductor 121. An output terminal of the amplifier 112 is connected to an input terminal of the inductor 122.

An output terminal of the inductor 121 is connected to one of two terminals (first and second terminals) on a primary side of the balun 131, and an output terminal of the inductor 122 is connected to the other terminal.

One of two terminals on a secondary side of the balun 131 is connected to a load 141, and the other terminal is grounded.

The balun 131 is an example of a combiner (first combiner). In the present description, the combiner is an element that includes at least one winding wire on each of the primary side and the secondary side formed such that the winding wire on the primary side and the winding wire on the secondary side are magnetically coupled with each other and that combines a plurality of signals input separately to the primary side and outputs a resultant combined signal from the secondary side. Note that the combiner may be, for example, a transformer.

That is, two orthogonal high-frequency signals respectively output from amplifiers 111 and 112 are input to the respective terminals on the primary side of the balun 131 via the respective inductors 121 and 122, and the balun 131 combines the input two high-frequency signals. As a result, a quadrature modulation signal is generated. The balun 131 outputs the generated quadrature modulation signal from one of the two electrodes on the secondary side to the load 141.

The inductors 121 and 122 and the balun 131 may be disposed on a semiconductor chip or outside the semiconductor chip.

Note that the circuit configuration of the balun 131 is not limited to the example illustrated in FIG. 1.

An output voltage Vout of the quadrature modulation signal output from the balun 131 to the load 141 is equal to a voltage obtained when an output voltage signal $V_I$ output from the amplifier 111 on the I side and an output voltage signal $V_Q$ output from the amplifier 112 on the Q side are separately input and combined together, as described in equation (1) shown below:

$$V_{out} = \frac{n_I}{N}V_I - \frac{n_Q}{N}V_Q \quad (1)$$

Note that the output voltage signal $V_I$ is a signal proportional to a digital code that controls an output amplitude of the amplifier 111, and the output voltage signal $V_Q$ is a signal proportional to a digital code that controls an output amplitude of the amplifier 112. In equation (1), $n_I$ denotes the number of Class-D power amplifiers in operation in the amplifier 111 on the I side, $n_Q$ denotes the number of Class-D power amplifiers in operation in the amplifier 112 on the Q side, N denotes the total number of Class-D power amplifiers included in each of the amplifiers 111 and 112, $V_I$ denotes the output voltage signal of the amplifier 111 on the I side, and $V_Q$ denotes the output voltage signal of the amplifier 112 on the Q side.

On the other hand, in a conventional circuit configuration (in which a plurality of amplifiers are connected directly, not through inductors, to one balun, an output voltage output from the balun is given by equation (2) shown below:

$$V_{out} = \frac{Z_L\left(\frac{n_I}{N}V_1 - \frac{n_Q}{N}V_2\right)}{\sqrt{(Z_L+2r)^2 + \frac{4}{(\omega NC)^2}}} e^{j\theta}, \quad (2)$$

$$\theta = \tan^{-1}\left\{\frac{2}{\omega C(Z_L+2r)}\right\}$$

As can be seen from equation (2), the amplitude of the output voltage in the conventional circuit configuration is lower than the amplitude of the output voltage represented by equation (1), and a phase rotation $\theta$ occurs. Note that in equation (2), $Z_L$ denotes load impedance.

Figure 2:
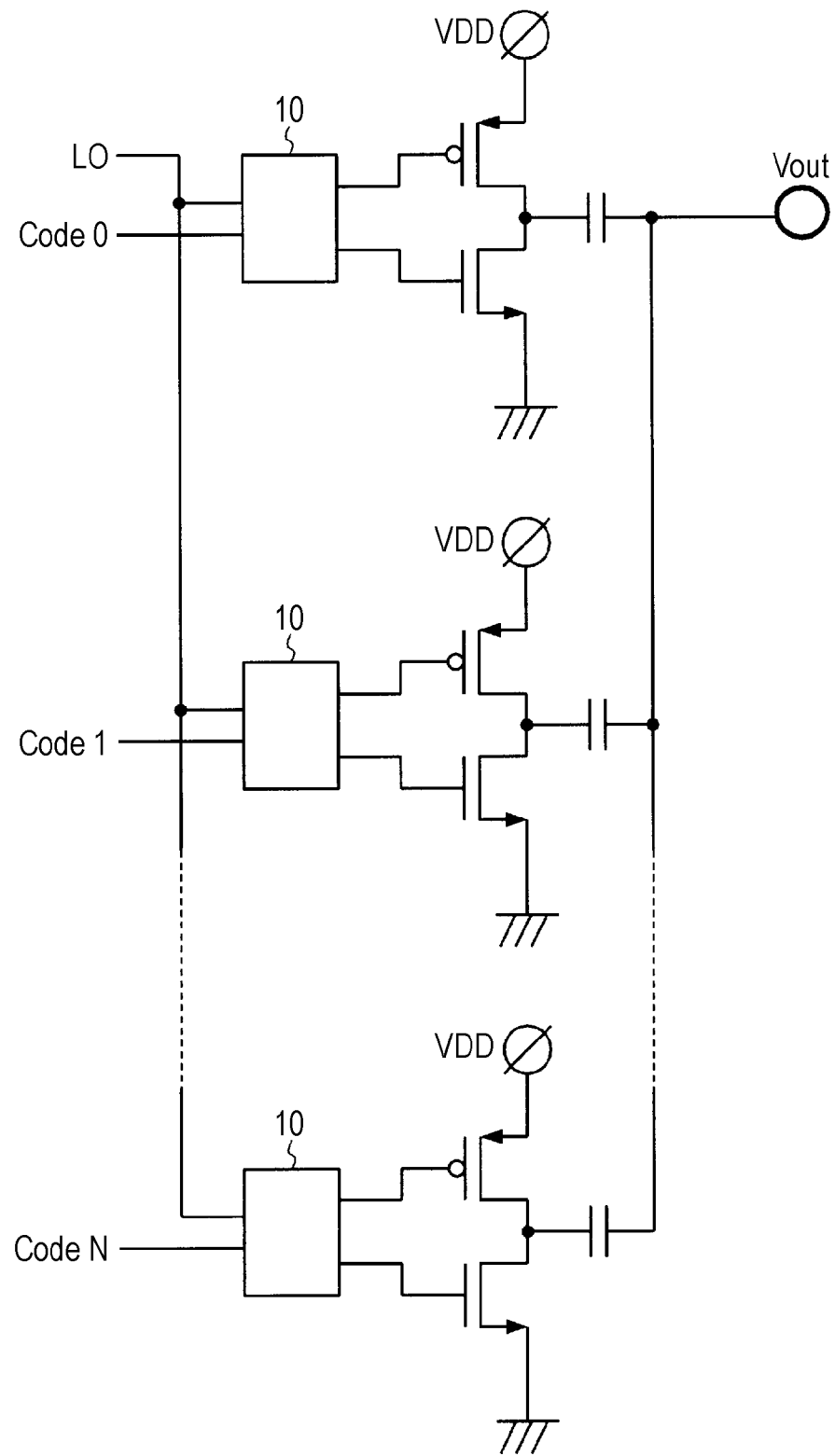
FIG. 2 is a diagram illustrating an example of a circuit configuration of a switched capacitor power amplifier included in a quadrature modulator according to one of first to fifth embodiments of the present disclosure.

Next, the switched capacitor power amplifiers (the amplifiers 111 and 112) are described in further detail below. FIG. 2 is a diagram illustrating an example of a circuit configuration of a switched capacitor power amplifier. As illustrated in FIG. 2, the switched capacitor power amplifier includes a plurality of Class-D power amplifiers connected in parallel. Each Class-D power amplifier has a logic circuit 10. A high-frequency signal (LO) and a low-speed digital code signal (Code 0, 1, or N) are input to each logic circuit 10.

Figure 3:
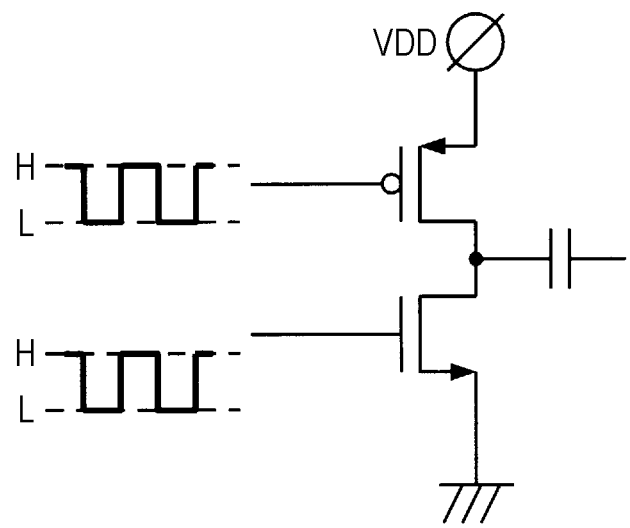
FIG. 3 is an equivalent circuit of a Class-D power amplifier in a state in which it is operating at an H-level of digital code.

FIG. 3 illustrates a basic operation mode of a single Class-D power amplifier in which an H-level digital code is used. In this case, high-frequency voltages with a waveform similar to a rectangular wave are input respectively to gates of a PMOS transistor and an NMOS transistor forming the Class-D power amplifier. The Class-D power amplifier performs a Class-D operation and outputs a signal with a rectangular wave. In the operation of the Class-D power amplifier, a current flows only at a moment when switching occurs in the transistors, and thus the Class-D power amplifier is capable of operating with a high power efficiency, which is even higher than the power efficiency of a Class-B power amplifier generally known as a high efficiency linear amplifier.

Figure 4:
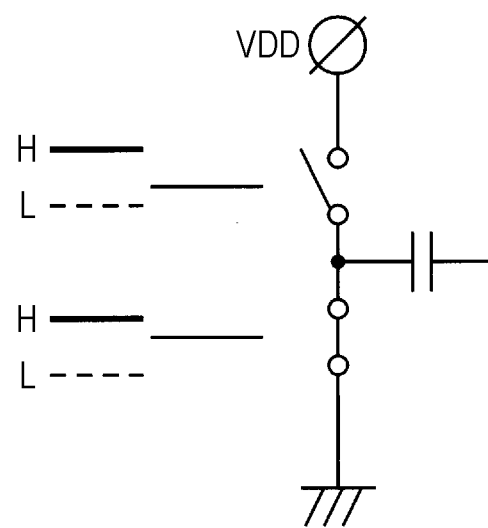
FIG. 4 is an equivalent circuit of a Class-D power amplifier in a state in which it is not operating at an L-level of digital code.

FIG. 4 illustrates a single Class-D power amplifier that is in a non-operation mode according to an L-level digital code. In this mode, an H-level signal is input to the gates of both the NMOS transistor and the PMOS transistor. As a result, the drain of the NMOS transistor is grounded and thus the drain voltage of the NMOS transistor becomes equal to the L-level, and a capacitance C is equivalently connected between the output terminal and a ground plane VSS.

Figure 5:
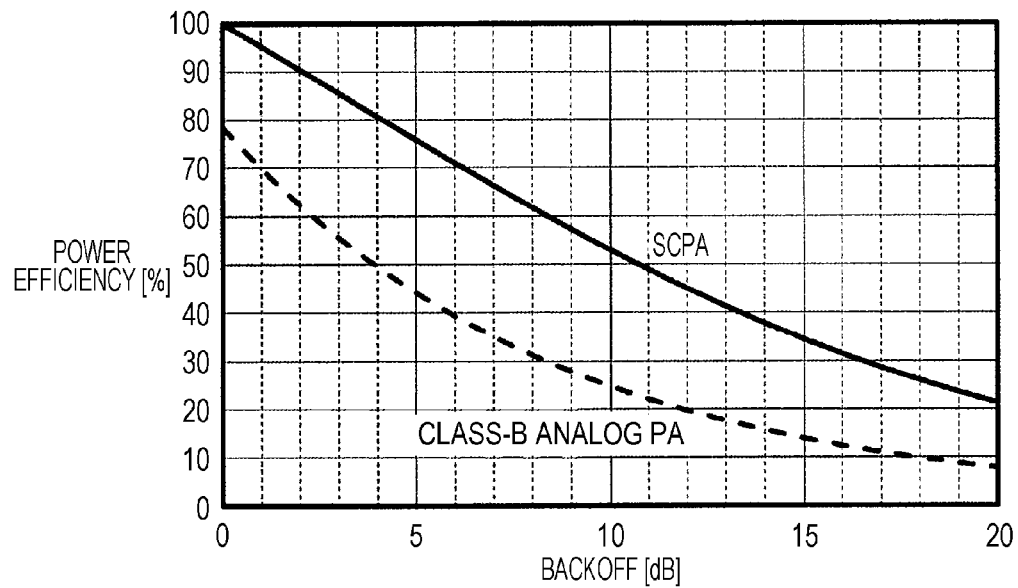
FIG. 5 is a graph illustrating a power efficiency as a function of a backoff for each of a Class-B power amplifier and a switched capacitor power amplifier.

FIG. 5 is a graph representing a theoretical efficiency of a switched capacitor power amplifier (SCPA) used in the quadrature modulator 100 according to the present embodiment in comparison with a theoretical efficiency of a Class-B power amplifier (Class-B analog PA) which is a common power amplifier with a high efficiency. As illustrated in FIG. 5, the SCPA is better in power efficiency than the Class-B analog PA.

In the switched capacitor power amplifier described above, it is possible to control, using a digital code, the number of Class-D power amplifiers to be operated. That is, it is possible to control the amplitude of the output voltage Vout of the switched capacitor power amplifier by changing the ratio between the number of Class-D power amplifiers that operate in the mode illustrated in FIG. 3 and the number of Class-D power amplifiers that operate in the mode illustrated in FIG. 4.

Figure 6:
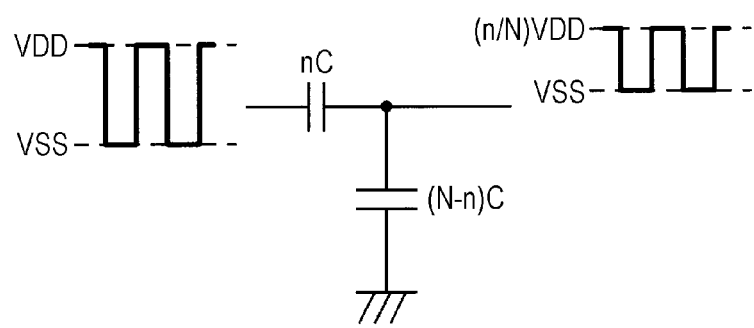
FIG. 6 is a diagram illustrating a manner in which an output voltage changes depending on a digital code value.

FIG. 6 is a diagram illustrating a relationship between capacitance and an output voltage for a case in which the number of Class-D power amplifiers in operation is n, the total number of Class-D power amplifiers is N, and the capacitance of each Class-D power amplifier is C. In FIG. 6, if it is assumed that the voltage waveform at the drain terminal of the NMOS transistor illustrated in FIG. 3 swings between the ground voltage VSS and the power supply voltage VDD, the output voltage Vout of the SCPA illustrated in FIG. 2 is given as follows. That is, the waveform of the output voltage Vout of the SCPA is a waveform obtained as a result of capacitive dividing of a rectangular wave swinging up to the power supply voltage VDD by the total capacitance nC of n Class-D power amplifiers being in operation and the total capacitance (N−n)C of (N−n) Class-D power amplifiers not being in operation. The maximum voltage of this waveform is (n/N)VDD, which is proportional to the number n of Class-D power amplifiers being in operation.

The capacitance of the internal impedance seen from the output terminal into the inside of the switched capacitor power amplifier is constant without changing with the value of n.

Figure 7:
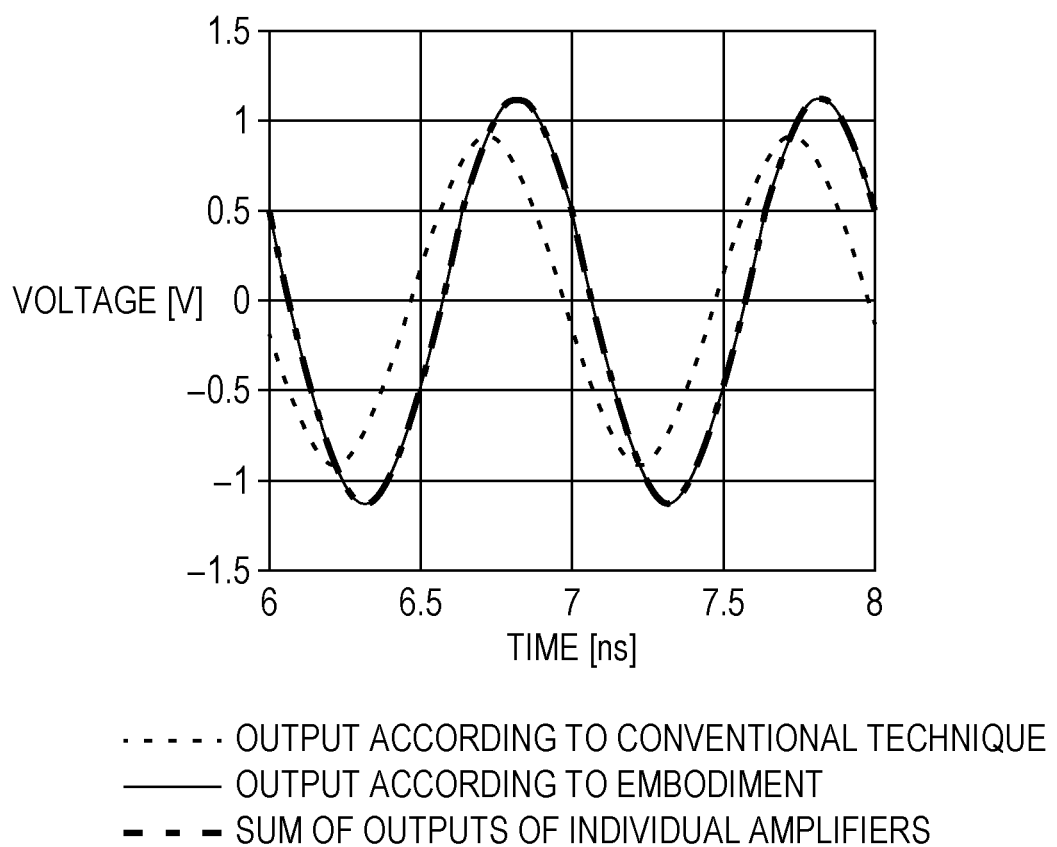
FIG. 7 is a graph illustrating a result obtained when combining is performed using a method according to a first embodiment of the disclosure and a result obtained when combining is performed using a conventional method.

FIG. 7 illustrates a result of a simulation of the output signal obtained for the circuit configuration (illustrated in FIG. 1) according to the present embodiment for a case where $n_I$=N/2 and $n_Q$=N in comparison with the output signal obtained fro the conventional circuit configuration (in which a plurality of power amplifiers are connected directly, not through inductors, to a single balun). In FIG. 7, a dash-dot line represents the sum of outputs of individual amplifiers simulated separately for the I side and the Q side. A broken line represents an output waveform for a case where outputs are combined using the conventional circuit configuration. In FIG. 7, the broken line indicates that the voltage amplitude has a slight phase shift with respect to that represented by the dash-dot line, that is, the broken line indicates that a loss and a phase rotation occur. On the other hand, a solid line represents a result of combining according to the present embodiment. As can been seen, the solid line overlaps the dash-dot line, which means that no loss occurs.

As described above, in the quadrature modulator 100 according to the present embodiment, orthogonal high-frequency signals are respectively amplified by two switched capacitor power amplifiers, and the amplified high-frequency signals are combined by a balun and a resultant combined signal is output as a quadrature modulation signal. In this quadrature modulator 100, the switched capacitor power amplifiers are connected to the primary side of the balun via the inductors. By forming the quadrature modulator 100 in the above-described manner, it becomes possible, using the simple circuit configuration, to combine the outputs of the two switched capacitor power amplifiers without generating a combination loss. Furthermore, even when the backoff is large, it is possible to achieve a high-efficiency operation and a high output power. Furthermore, the quadrature modulator 100 does not need to have a margin for the combination loss, and thus it is possible to reduce the size of the switched capacitor power amplifier.

Second Embodiment

A quadrature modulator 200 according to a second embodiment of the present disclosure is described below.

Figure 8:
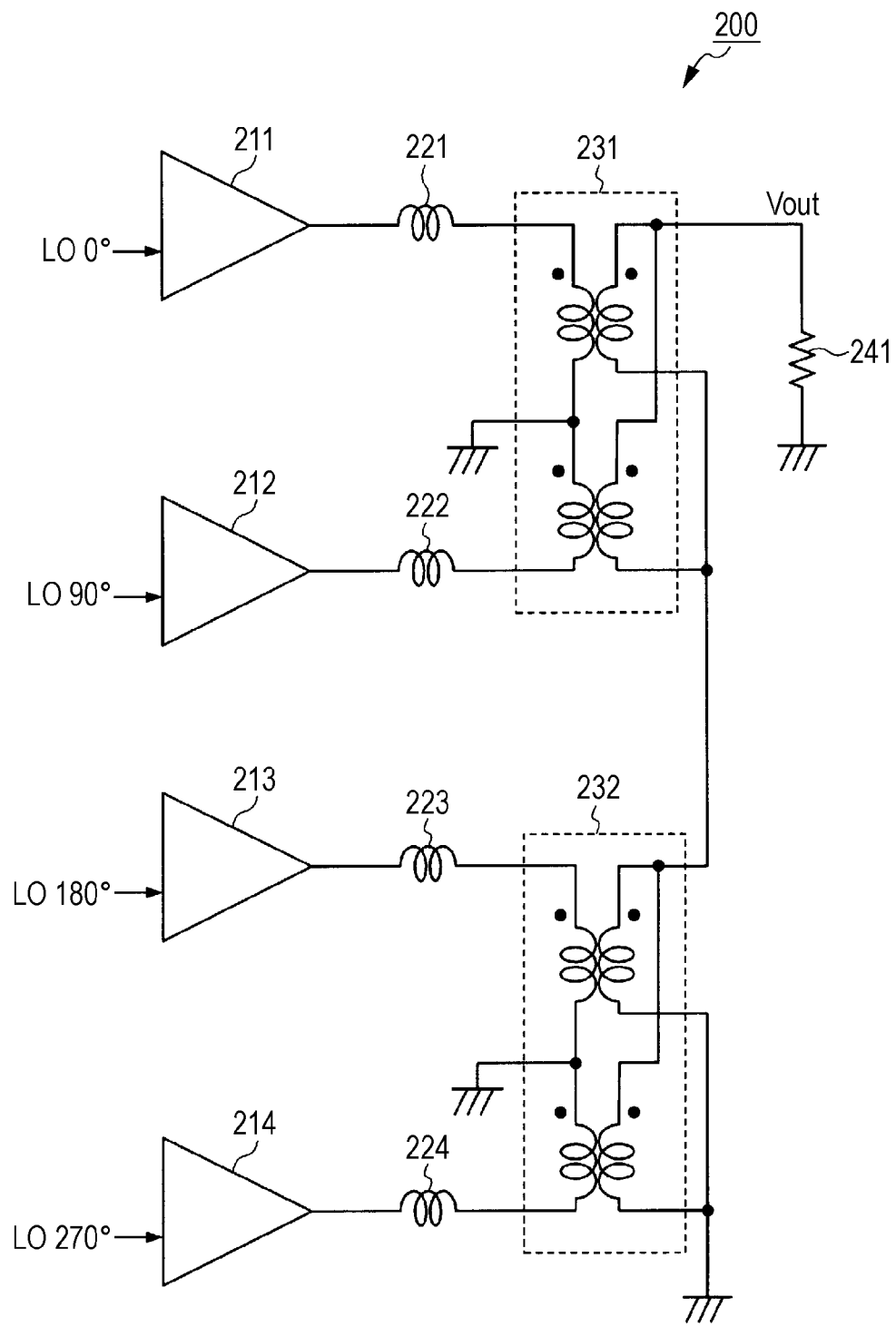
FIG. 8 is a diagram illustrating an example of a circuit configuration of a quadrature modulator according to a second embodiment of the present disclosure.

FIG. 8 is a diagram illustrating an example of a circuit configuration of the quadrature modulator 200 according to the second embodiment. As illustrated in FIG. 8, the quadrature modulator 200 includes amplifiers 211, 212, 213, and 214, inductors 221, 222, 223, and 224, and baluns 231 and 232.

The amplifiers 211 and 212 the inductors 221 and 222, and the balun 231 are the same as the amplifiers 111 and 112, the inductors 121 and 122, and the balun 131 described above in the first embodiment, and thus a further description thereof is omitted. However, note that one of the electrodes on the secondary side of the balun 231 is connected to the load 241 as in the first embodiment, but the other one of the electrodes is connected to one of two electrodes on the secondary side of the balun 232 unlike the first embodiment in which it is grounded.

Thus, the amplifiers 213 and 214, the inductors 223 and 224, and the balun 232 are described below.

The amplifier 213 and the amplifier 214 are each a switched capacitor power amplifier.

As in the first embodiment, a high-frequency signal with a phase of 0° is input to the amplifier 211, and a high-frequency signal with a phase of 90° is input to the amplifier 212. Furthermore, there is a relative phase difference of 90° between a high-frequency signal input to the amplifier 213 and a high-frequency signal input to the amplifier 214. That is, the phases of these two high-frequency signals are different by 90° such that the two high-frequency signals are orthogonal to each other. In FIG. 8, by way of example, a high-frequency signal with a phase of 180° is input to the amplifier 213, and a high-frequency signal with a phase of 270° is input to the amplifier 214. Thus, the high-frequency signals input respectively to the amplifiers 211, 212, 213, and 214 are relatively different in phase by 90° between any adjacent high-frequency signals.

An output terminal of the amplifier 213 is connected to an input terminal of the inductor 223. An output terminal of the amplifier 214 is connected to an input terminal of the inductor 224.

An output terminal of the inductor 223 is connected to one of two terminals (third and fourth terminals) on a primary side of the balun 232, and an output terminal of the inductor 224 is connected to the other terminal.

Of terminals on a secondary side of the balun 232, one terminal is connected to one of terminals on a secondary side of the balun 231 (that is, to a terminal opposite to a terminal connected to the load 241), and the other terminal is grounded.

The balun 232 is an example of a combiner (second combiner). Note that the combiner is an element, as described above, that includes at least one winding wire on each of the primary side and the secondary side formed such that the winding wire on the primary side and the winding wire on the secondary side are magnetically coupled with each other and that combines a plurality of signals input separately to the primary side and outputs a resultant combined signal from the secondary side. Note that the combiner may be, for example, a transformer.

That is, two orthogonal high-frequency signals respectively output from amplifiers 213 and 214 are input to the respective terminals on the primary side of the balun 232 via the respective inductors 223 and 224, and the balun 232 combines the input two high-frequency signals. As a result, a quadrature modulation signal is generated. The balun 232 outputs the generated quadrature modulation signal from one of the two electrodes on the secondary side to the secondary side of the balun 231.

In the quadrature modulator 200 described above, a part including the amplifiers 211 and 212, the inductors 221 and 222, and the primary side of the balun 231 is referred to as a positive phase side, and a part including the amplifiers 213 and 214, the inductors 223 and 224, and the primary side of the balun 232 is referred to as an opposite phase side. Note that the phases of the high-frequency signals are different by 180° between the positive phase side and the opposite phase side, that is, the positive phase side and the opposite phase side operate in a differential manner.

Thus, the output voltage signal output from the positive-phase-side switched capacitor power amplifier and the output voltage signal output from the opposite-phase-side switched capacitor power amplifier are combined together and a resultant combined signal is output as the output voltage Vout of the quadrature modulation signal from the balun 231 to the load 241. The output voltage signal output from the positive-phase-side switched capacitor power amplifier is a signal proportional to a digital code that controls an output amplitude of the positive-phase-side switched capacitor power amplifier. On the other hand, the output voltage signal output from the opposite-phase-side switched capacitor power amplifier is a signal proportional to a digital code that controls an output amplitude of the opposite-phase-side switched capacitor power amplifier.

The inductors 221, 222, 223, and 224, and the baluns 231 and 232 may be disposed on a semiconductor chip or outside the semiconductor chip.

Note that the circuit configuration of the baluns 231 and 232 is not limited to the example illustrated in FIG. 8.

The above-described quadrature modulator 200 according to the present embodiment also provides advantageous effects similar to those achieved by the first embodiment. Furthermore, in the quadrature modulator 200 according to the present embodiment, the quadrature modulation is performed on the high-frequency signals output from the two switched capacitor power amplifiers separately in the respective baluns on the positive phase side and the opposite phase side, and thus the quadrature modulator 200 according to the present embodiment provides an additional advantageous effect that spurious signals generated in the positive phase side and the opposite phase side, which are opposite in phase, are cancelled out on the secondary side of the balun between the positive phase side and the opposite phase side.

Third Embodiment

A quadrature modulator 300 according to a third embodiment of the present disclosure is described below.

Figure 9:
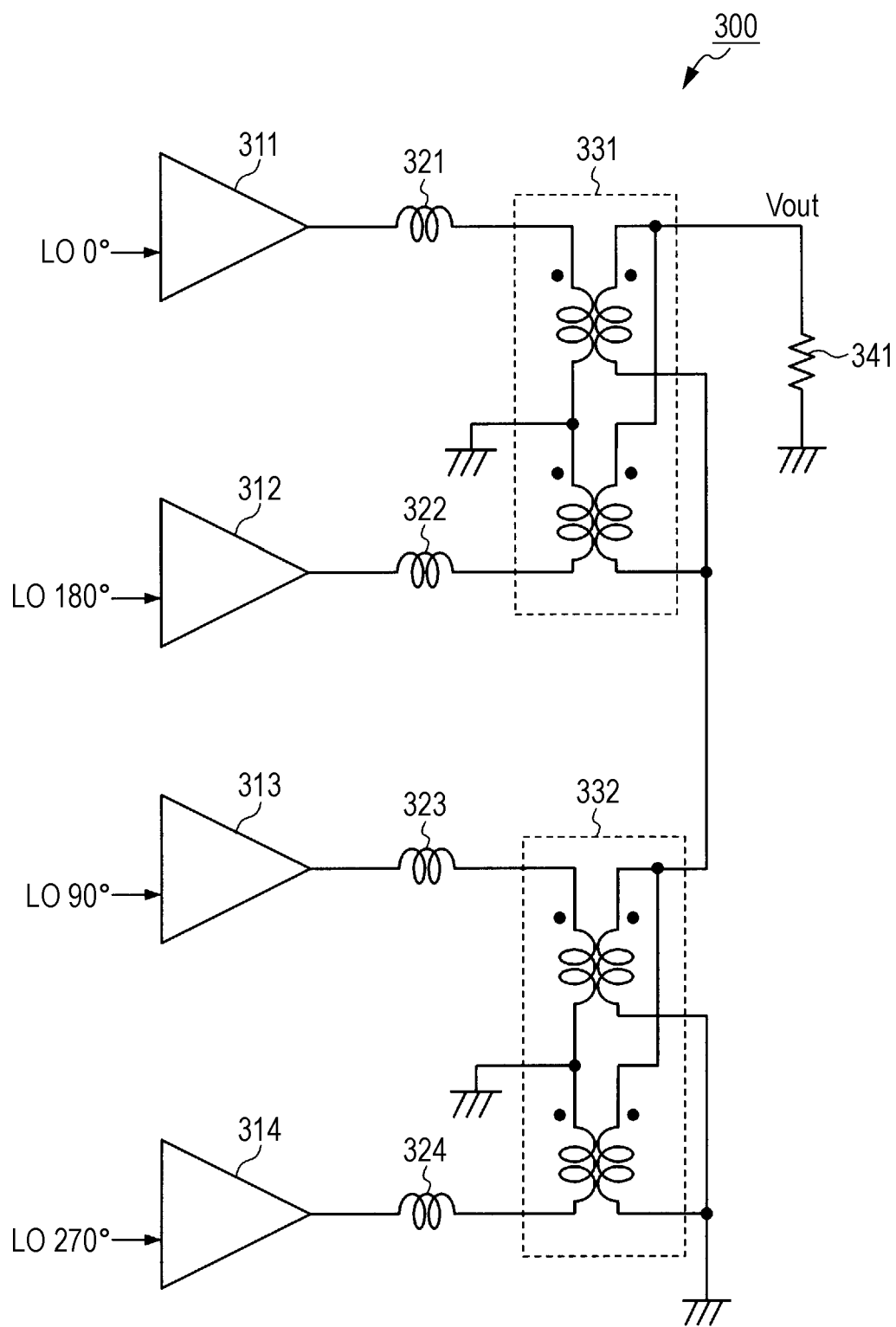
FIG. 9 is a diagram illustrating an example of a circuit configuration of a quadrature modulator according to a third embodiment of the present disclosure.

FIG. 9 is a diagram illustrating an example of a circuit configuration of the quadrature modulator 300 according to the third embodiment. As illustrated in FIG. 9, the quadrature modulator 300 includes amplifiers 311, 312, 313, and 314, inductors 321, 322, 323, and 324, and baluns 331 and 332.

The amplifiers 311 to 314, the inductors 321 to 324, and the baluns 331 and 332 are respectively the same as the amplifiers 211 to 214, the inductors 221 to 224, and the baluns 231 and 232 described above in the second embodiment, and thus a further description thereof is omitted. However, the third embodiment is different from the second embodiment described above with reference to FIG. 8 in that a high-frequency signal with a phase of 180° is input to the amplifier 312, and a high-frequency signal with a phase of 90° is input to the amplifier 313.

That is, in the quadrature modulator 300, there is a relative phase difference of 180° between the high-frequency signal input to the amplifier 311 and the high-frequency signal input to the amplifier 312, and there is a relative phase difference of 180° between the high-frequency signal input to the amplifier 313 and the high-frequency signal input to the amplifier 314. Furthermore, there is a relative phase difference of 90° between the high-frequency signal input to the amplifier 311 and the high-frequency signal input to the amplifier 313.

In the quadrature modulator 300 described above, a part including the amplifiers 311 and 312, the inductors 321 and 322, and the primary side of the balun 331 is referred to as an I side, and a part including the amplifiers 313 and 314, the inductors 323 and 324, and the primary side of the balun 332 is referred to as a Q side. Note that there is a phase difference of 90° between high-frequency signals on the I side and high-frequency signals on the Q side, and thus they are orthogonal to each other.

Thus, in the quadrature modulator 300, the output voltage Vout of the quadrature modulation signal output from the balun 331 to the load 341 is equal to a value given by separately inputting the output voltage signal from the I-side switched capacitor power amplifier and the output voltage signal from the Q-side switched capacitor power amplifier and then combining them together. The output voltage signal from the I-side switched capacitor power amplifier is proportional to the digital code that controls the output amplitude of the I-side switched capacitor power amplifier, and the output voltage signal from the Q-side switched capacitor power amplifier is proportional to the digital code that controls the output amplitude of the Q-side switched capacitor power amplifier.

The above-described quadrature modulator 300 according to the present embodiment also provides advantageous effects similar to those achieved by the first embodiment. Furthermore, in the quadrature modulator 300 according to the present embodiment, the I side and the Q side are configured using two switched capacitor power amplifiers such that there is a relative phase difference of 180° between the I side and the Q side, and thus the quadrature modulator 300 according to the present embodiment provides an additional advantageous effect that spurious signals caused by digital codes for adjusting the amplitudes with a clock frequency are opposite in phase between the I side and the Q side and thus they are cancelled out on the primary side of the balun.

The inductors 321, 322, 323, and 324, and the baluns 331 and 332 may be disposed on a semiconductor chip or outside the semiconductor chip.

Note that the circuit configuration of the baluns 331 and 332 is not limited to the example illustrated in FIG. 9.

Fourth Embodiment

A fourth embodiment described below discloses a manner in which the values of the inductors described above in the first to third embodiments are determined.

In the present embodiment, the values of the inductors 121 and 122 in FIG. 1, the inductors 221, 222, 223, and 224 in FIG. 8, and the inductors 321, 322, 323, and 324 in FIG. 9 are determined as described below. That is, the value of each inductors is set so as to resonate with the total internal capacitance of a corresponding amplifier connected to that inductance at a frequency of a high-frequency signal input to that amplifier.

Figure 10:
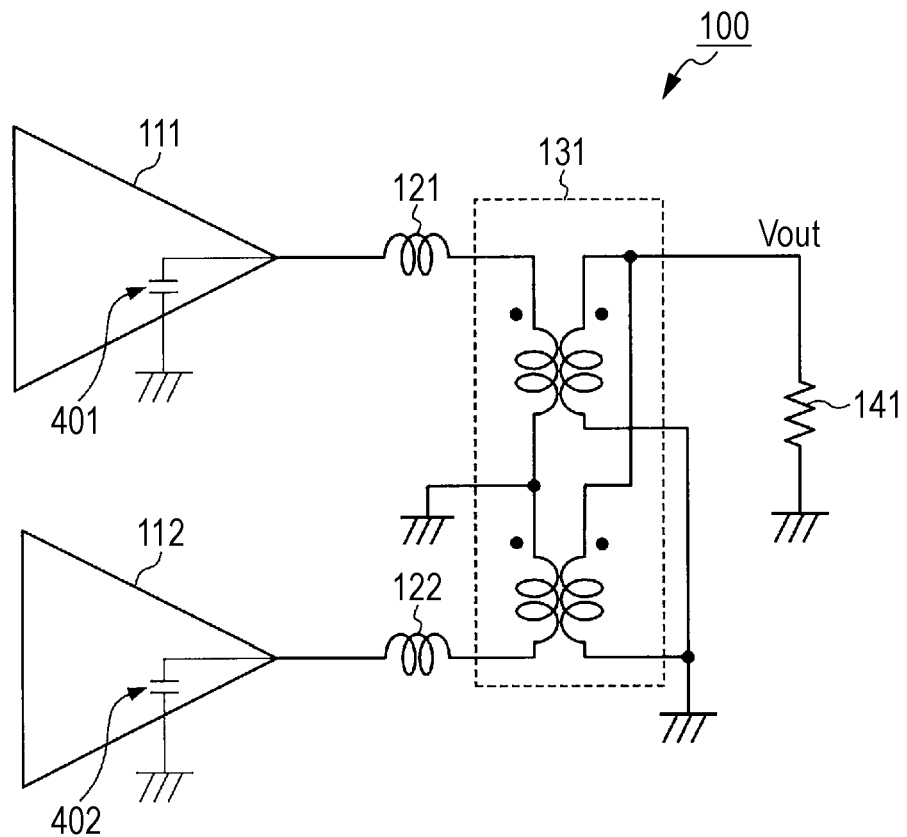
FIG. 10 is a diagram illustrating an example of a circuit configuration of a quadrature modulator according to a fourth embodiment of the present disclosure.

The manner of setting the inductance is described in further detail below taking the quadrature modulator 100 according to the first embodiment as a specific example. In FIG. 10, the value of the total equivalent capacitance 401 of the amplifier 111 is denoted by $C_I$, and the value of the total equivalent capacitance 402 of the amplifier 112 is denoted by $C_Q$. In this configuration, the inductance value $L_I$ of the inductor 121 is set to be equal to a value calculated according to equation (3) described below, and the inductance value $L_Q$ of the inductor 122 is set to be equal to a value calculated according to equation (4) described below such that a combination of the inductance value $L_I$ and the capacitance value $C_I$ and a combination of the inductance value $L_Q$ and the capacitance value $C_Q$ respectively cause resonance to occur at the signal frequency f.

$$L_I = \frac{1}{(2\pi f)^2 C_I} \quad (3)$$

$$L_Q = \frac{1}{(2\pi f)^2 C_Q} \quad (4)$$

Note that the capacitance $C_I$ and the capacitance $C_Q$ each may be given by the total capacitance of the switched capacitor power amplifier illustrated in FIG. 2 or the sum of the total capacitance of the switched capacitor power amplifier and parasitic capacitance.

In the present embodiment, as described above, parameters of the quadrature modulator are set such that resonance occurs between the inductance value of the inductor and the internal equivalent capacitance of the switched capacitor power amplifier. That is, the series resonance in the quadrature modulator makes it possible to extract a signal with a particular necessary frequency, and thus it is possible to suppress unnecessary harmonics. Besides, it is possible to minimize a loss of a signal at a necessary frequency.

Fifth Embodiment

A fifth embodiment of the present disclosure discloses a transmission apparatus including a quadrature modulator according to one of the first to fourth embodiments described above.

Figure 11:
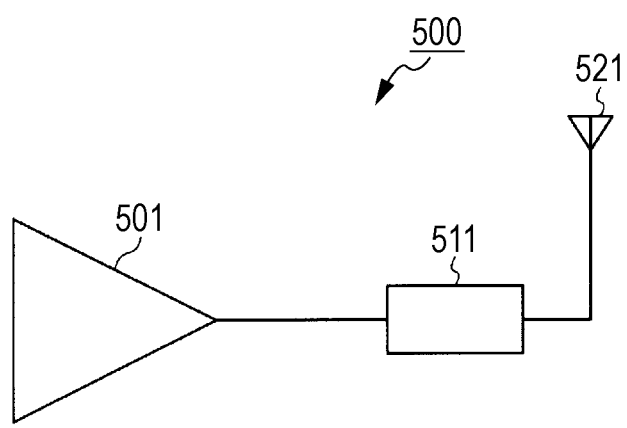
FIG. 11 is a block diagram illustrating an example of a configuration of a transmission apparatus according to a fifth embodiment of the present disclosure.

FIG. 11 is a diagram illustrating an example of a configuration of a transmission apparatus 500 according to the fifth embodiment. As illustrated in FIG. 11, the transmission apparatus 500 includes a quadrature modulator 501, a matching circuit 511, and an antenna 521. The quadrature modulator 501 is the quadrature modulator according to one of the first to fourth embodiments described above. The matching circuit 511 optimizes the impedance of the antenna 521 seen from the quadrature modulator 501. The optimum impedance may vary depending on which characteristics are important.

As described above, the transmission apparatus 500 according to the present embodiment includes the quadrature modulator 501 that may be the quadrature modulator according to one of the first to fourth embodiments. As described above, the quadrature modulator according to one of the first to fourth embodiments does not need to have a margin for a combination loss, which makes it possible to reduce the size of the switched capacitor power amplifier. Therefore, a reduction in size is also achieved for the transmission apparatus 500 including this quadrature modulator. The quadrature modulator according to one of the first to fourth embodiments is low in loss and needs low power to obtain necessary output power. Therefore, a reduction in power consumption is also achieved for the transmission apparatus 500 including this quadrature modulator.

In a case where the quadrature modulator 200 according to the second embodiment or the quadrature modulator 300 according to the third embodiment is employed as the quadrature modulator 501, it is possible to suppress an unnecessary signal output from the transmission apparatus 500.

As described above, the quadrature modulator according to an aspect of the present disclosure includes a first switched capacitor power amplifier that amplifies a first high-frequency signal having a first phase; a second switched capacitor power amplifier that amplifies a second high-frequency signal having a second phase different from the first phase, a first combiner which comprises at least one pair of winding wires that are magnetically coupled to each other, one winding wire in one pair being disposed on a primary side to which the amplified first high-frequency signal and the amplified second high-frequency signal are separately input and the other winding wire in the one pair being disposed on a secondary side, the first combiner combining the input amplified first high-frequency signal and the input amplified second high-frequency signal to generate a quadrature modulation signal from the secondary side, a first inductor disposed between the first switched capacitor power amplifier and the primary side of the first combiner, and a second inductor disposed between the second switched capacitor power amplifier and the primary side of the first combiner.

In the quadrature modulator described above, the first inductor may be disposed between an output terminal of the first switched capacitor power amplifier and a first terminal on the primary side of the first combiner, and the second inductor may be disposed between an output terminal of the second switched capacitor power amplifier and a second terminal on the primary side of the first combiner.

In the quadrature modulator described above, the first phase may be 0°, and the second phase may be 90°.

The quadrature modulator described above may further include a third switched capacitor power amplifier that amplifies a third high-frequency signal having a third phase, a fourth switched capacitor power amplifier that amplifies a fourth high-frequency signal having a fourth phase, a second combiner which comprises at least one pair of winding wires that are magnetically coupled to each other, one winding wire in one pair being disposed on a primary side to which the amplified third high-frequency signal and the amplified fourth high-frequency signal are separately input and the other winding wire in the one pair being disposed on a secondary side, the second combiner combining the input amplified third high-frequency signal and the input amplified fourth high-frequency signal to generate a second quadrature modulation signal from the secondary side, a third inductor disposed between an output terminal of the third switched capacitor power amplifier and a third terminal on the primary side of the second combiner, and a fourth inductor disposed between an output terminal of the fourth switched capacitor power amplifier and a fourth terminal on the primary side of the second combiner, wherein the second combiner outputs the second quadrature modulation signal from the secondary side of the second combiner to the secondary side of the first combiner.

In the quadrature modulator described above, the first phase may be 0°, the second phase may be 90°, the third phase may be 180°, and the fourth phase may be 270°.

In the quadrature modulator described above, the first phase may be 0°, the second phase may be 180°, the third phase may be 90°, and the fourth phase may be 270°.

In the quadrature modulator described above, the first switched capacitor power amplifier may include a first internal capacitance, the second switched capacitor power amplifier may include a second internal capacitance, the first inductor may be connected in series to the first internal capacitance, and the second inductor may be connected in series to the second internal capacitance.

In the quadrature modulator described above, the first inductor may have an inductance value that resonates with the first internal capacitance at a frequency of the amplified first high-frequency signal output from the first inductor, and the second inductor may have an inductance value that resonates with the second internal capacitance at a frequency of the amplified second high-frequency signal output from the second inductor.

In the quadrature modulator described above, the third switched capacitor power amplifier may include a third internal capacitance, the fourth switched capacitor power amplifier may include a fourth internal capacitance, the third inductor may be connected in series to the third internal capacitance, and the fourth inductor may be connected in series to the fourth internal capacitance.

In the quadrature modulator described above, the third inductor may have an inductance value that resonates with the third internal capacitance at a frequency of the amplified third high-frequency signal output from the third inductor, and the fourth inductor may have an inductance value that resonates with the fourth internal capacitance at a frequency of the amplified fourth high-frequency signal output from the fourth inductor.

The techniques disclosed herein are advantageous for use in a wide variety of apparatuses, systems, methods, programs, and the line in which quadrature modulation is performed using switched capacitor power amplifiers.

What is claimed is:

1. A quadrature modulator comprising:
    a first switched capacitor power amplifier that amplifies a first high-frequency signal having a first phase according to a first data input;
    a second switched capacitor power amplifier that amplifies a second high-frequency signal having a second phase different from the first phase according to a second data input;
    a first combiner which comprises at least one pair of winding wires that are magnetically coupled to each other, one winding wire in one pair being disposed on a primary side to which the amplified first high-frequency signal and the amplified second high-frequency signal are separately input and the other winding wire in the one pair being disposed on a secondary side, the first combiner combining the input amplified first high-frequency signal and the input amplified second high-frequency signal to generate a quadrature modulation signal from the secondary side;
    a first inductor disposed between the first switched capacitor power amplifier and the primary side of the first combiner; and a second inductor disposed between the second switched capacitor power amplifier and the primary side of the first combiner.

2. The quadrature modulator according to claim 1, wherein
the first inductor is disposed between an output terminal of the first switched capacitor power amplifier and a first terminal on the primary side of the first combiner; and
the second inductor is disposed between an output terminal of the second switched capacitor power amplifier and a second terminal on the primary side of the first combiner.

3. The quadrature modulator according to claim 1, wherein
the first phase is 0°; and
the second phase is 90°.

4. The quadrature modulator according to claim 1, further comprising:
a third switched capacitor power amplifier that amplifies a third high-frequency signal having a third phase according to a third data input;
a fourth switched capacitor power amplifier that amplifies a fourth high-frequency signal having a fourth phase according to a fourth data input;
a second combiner which comprises at least one pair of winding wires that are magnetically coupled to each other, one winding wire in one pair being disposed on a primary side to which the amplified third high-frequency signal and the amplified fourth high-frequency signal are separately input and the other winding wire in the one pair being disposed on a secondary side, the second combiner combining the input amplified third high-frequency signal and the input amplified fourth high-frequency signal to generate a second quadrature modulation signal from the secondary side;
a third inductor disposed between an output terminal of the third switched capacitor power amplifier and a third terminal on the primary side of the second combiner; and
a fourth inductor disposed between an output terminal of the fourth switched capacitor power amplifier and a fourth terminal on the primary side of the second combiner;
wherein the second combiner outputs the second quadrature modulation signal from the secondary side of the second combiner to the secondary side of the first combiner.

5. The quadrature modulator according to claim 4, wherein
the first phase is 0°;
the second phase is 90°;
the third phase is 180°; and
the fourth phase is 270°.

6. The quadrature modulator according to claim 4, wherein
the first phase is 0°;
the second phase is 180°;
the third phase is 90°; and
the fourth phase is 270°.

7. The quadrature modulator according to claim 1, wherein
the first switched capacitor power amplifier includes a first internal capacitance;
the second switched capacitor power amplifier includes a second internal capacitance;
the first inductor is connected in series to the first internal capacitance; and
the second inductor is connected in series to the second internal capacitance.

8. The quadrature modulator according to claim 7, wherein
the first inductor has an inductance value that resonates with the first internal capacitance at a frequency of the amplified first high-frequency signal output from the first inductor; and
the second inductor has an inductance value that resonates with the second internal capacitance at a frequency of the amplified second high-frequency signal output from the second inductor.

9. The quadrature modulator according to claim 4, wherein
the third switched capacitor power amplifier includes a third internal capacitance;
the fourth switched capacitor power amplifier includes a fourth internal capacitance;
the third inductor is connected in series to the third internal capacitance; and
the fourth inductor is connected in series to the fourth internal capacitance.

10. The quadrature modulator according to claim 9, wherein
the third inductor has an inductance value that resonates with the third internal capacitance at a frequency of the amplified third high-frequency signal output from the third inductor; and
the fourth inductor has an inductance value that resonates with the fourth internal capacitance at a frequency of the amplified fourth high-frequency signal output from the fourth inductor.

* * * * *